United States Patent
Kang et al.

(10) Patent No.: US 9,641,156 B1
(45) Date of Patent: May 2, 2017

(54) ACTIVE CIRCULATOR WITH CASCODE TRANSISTOR

(71) Applicant: HRL LABORATORIES, LLC, Malibu, CA (US)

(72) Inventors: Jongchan Kang, Moorpark, CA (US); Hasan Sharifi, Agoura Hills, CA (US); Eric M. Prophet, Santa Barbara, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 14/949,044

(22) Filed: Nov. 23, 2015

Related U.S. Application Data (60) Provisional application No. 62/084,942, filed on Nov. 26, 2014.

(51) Int. Cl.
  *H01P 1/32* (2006.01)
  *H03H 11/38* (2006.01)
(52) U.S. Cl.
  CPC .................. *H03H 11/38* (2013.01)
(58) Field of Classification Search
  CPC .................. H03H 11/02; H03H 11/38
  USPC .................. 333/1, 100–103, 1.1, 24.2
  See application file for complete search history.

(56) References Cited

U.S. PATENT DOCUMENTS

| | | | |
|---|---|---|---|
| 3,860,893 A * | 1/1975 | Ropars | H03H 11/38 333/1.1 |
| 4,908,531 A * | 3/1990 | Podell | H03K 17/6871 327/409 |
| 5,101,179 A | 3/1992 | Jarrett et al. | |
| 5,144,266 A * | 9/1992 | Dougherty | H03H 11/38 330/277 |
| 8,044,733 B1 | 10/2011 | Arora et al. | |
| 2006/0087376 A1 | 4/2006 | Young et al. | |
| 2007/0182483 A1 | 8/2007 | Seyfried et al. | |
| 2013/0147535 A1 | 6/2013 | Hur et al. | |
| 2013/0169367 A1 | 7/2013 | Vickes et al. | |
| 2016/0149558 A1* | 5/2016 | Kang | H03H 11/38 333/1 |

OTHER PUBLICATIONS

U.S. Appl. No. 14/554,995, Kang et al., filed Nov. 26, 2014.
Shin et al., "A 1.5-9.6 GHz Monolithic Active Quasi-Circulator in 0.18 um CMOS Technology," *IEEE Microwave and Wireless Components Letters*, vol. 18, No. 12, pp. 797-799, (Dec. 2008).
Smith, Mark A., "GaAs Monolithic Implementation of Active Circulators," *IEEE Microwave Symposium*, pp. 1015-1016, (1988).

(Continued)

*Primary Examiner* — Dinh T Le
(74) *Attorney, Agent, or Firm* — Ladas & Parry (57) ABSTRACT

A multi-port active circulator includes a plurality of cascode circuits coupled to one another in a ring. Each respective cascode circuit of the plurality of cascode circuits is coupled to a respective port of a plurality of ports. Each respective cascode circuit includes a common source transistor, a common gate transistor coupled to the common source transistor, and a feedback circuit coupled from the common gate transistor to the common source transistor. Each common source transistor of each respective cascode circuit is coupled to a common junction point.

22 Claims, 5 Drawing Sheets

(56) References Cited

OTHER PUBLICATIONS

Tanaka et al., "Active Circulators—The Realization of Circulators using Transistors," *Proceeding of the IEEE*, vol. 53, Issue: 3, pp. 260-267, (Mar. 1965).
International Search Report & Written Opinion (ISR &WO) for PCT/US2014/067742 mailed on Jul. 30, 2015.
From U.S. Appl. No. 14/554,995, filed Nov. 26, 2014; Application and Office Actions, Not yet published.
From U.S. Appl. No. 14/554,995 (now U.S. 2016/0149558 A1): Non Final Office Action mailed on Oct. 21, 2016.

* cited by examiner

ACTIVE CIRCULATOR WITH CASCODE TRANSISTOR

CROSS REFERENCE TO RELATED APPLICATIONS

This application relates to and claims the benefit of priority from U.S. Provisional Patent Application 62/084,942, filed Nov. 26, 2014, and is related to U.S. patent application Ser. No. 14/554,995, filed Nov. 26, 2014, which are incorporated herein as though set forth in full.

STATEMENT REGARDING FEDERAL FUNDING

This invention was made under U.S. Government contract No. N00014-11-C-0025. The U.S. Government has certain rights in this invention.

TECHNICAL FIELD

This disclosure relates to active circulators.

BACKGROUND

Circulators are well known in the prior art. A circulator is an active or passive three- or four-port device, in which a microwave or radio frequency signal entering any port is transmitted only to the next port in rotation.

Circulators have numerous uses. For example, one port of a three port circulator may be connected to an antenna, while a receiver is connected to a second port of the circulator to receive signals received by the antenna and with a transmitter connected to a third port of the circulator to supply transmit signals to the antenna. The transmit signals are isolated by the circulator from the receiver, which might otherwise be damaged by those transmit signals.

The prior art includes: "Active Circulators—The Realization of Circulators using Transistors" S. Tanaka, N. Shimomura, K. Ohtake, Proceeding of the IEEE, March. Vol. 53, Issue: 3, pages: 260-267, 1965; "A 1.5-9.6 GHz Monolithic Active Quasi-Circulator in 0.18 um CMOS Technology" Shih-Chieh Shin, Jhih-Yu Huang, Kun You Lin and Huei Wang, IEEE Microwave and Wireless Components letters, Vol. 18, No 12 Dec. 2008; and "GaAs Monolithic Implementation of Active Circulator", Mark A. Smith, IEEE Microwave Symposium 1988, which are incorporated herein by reference.

The prior art also includes U.S. patent application Ser. No. 14/554,995, filed Nov. 26, 2014, which describes the active circulator shown in FIG. 1, and which is incorporated herein as though set forth in full.

Figure 1:
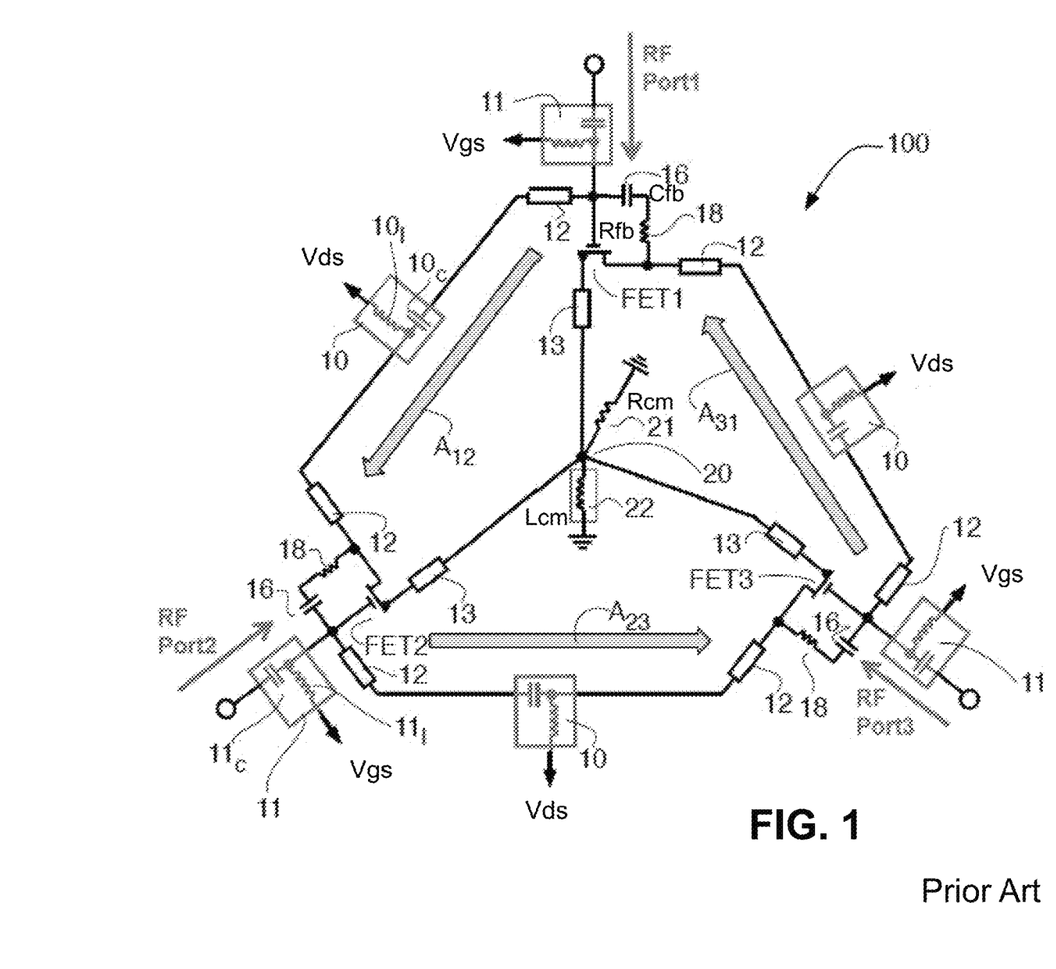
FIG. 1 an active circulator in accordance with the prior art.

In the prior art configuration shown in FIG. 1, to satisfy the operating condition for signal circulation and isolation, only a limited gate voltage and certain values of resistor Rfb 18 and resistor Rcm 21 may be used. Typically, the output impedance of the FETs is assumed to be very high, and Vgs is limited for operation to a small transconductance range. The resistor Rfb 18 and resistor Rcm 21 values may be set within a 70 Ohm to 300 Ohm range. However, because the actual FET output impedances vary dynamically depending on the Vgs or Vds condition, such a dynamically changing output impedance can break the active circulator operating condition at certain bias points and it may also very easily cause an unwanted oscillation. The active circulator of FIG. 1 is further described below.

Figure 2:
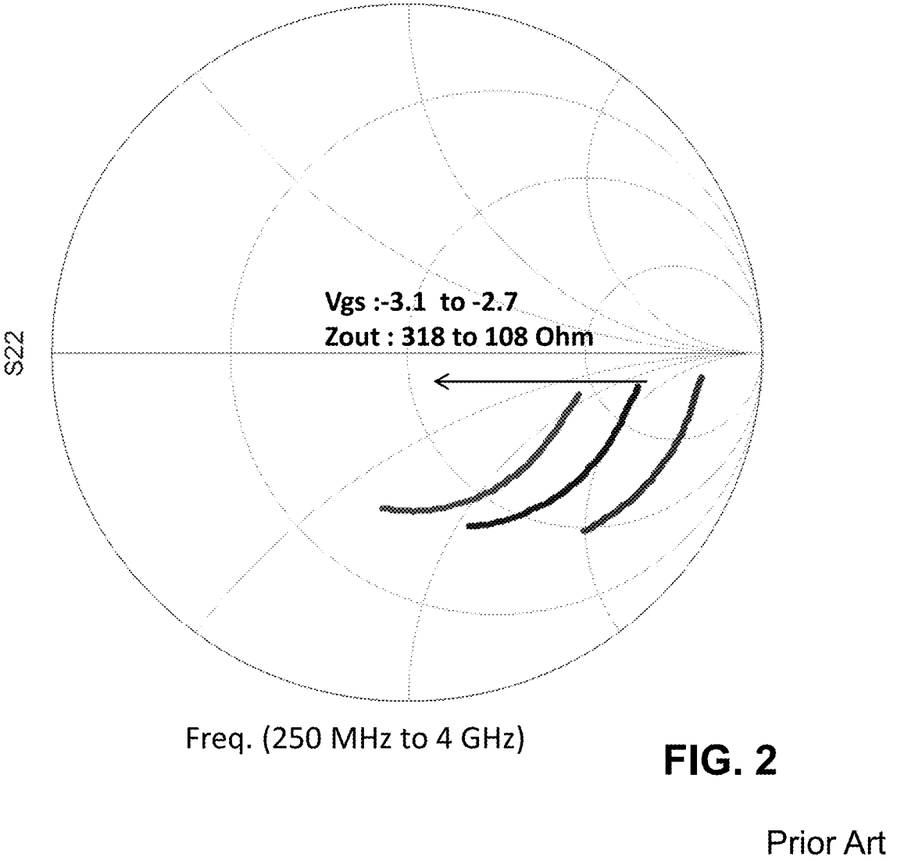
FIG. 2 shows how the output impedance S22 for a 450 um gate length GaN HEMT at Vds=7 V changes as Vgs varies in accordance with the prior art.

FIG. 2 shows an example of how an output impedance for a GaN HEMT with a gate length of 450 μm varies over Vgs for a fixed Vds=7V. As shown in FIG. 2, as the Vgs goes up from −3.1V to −2.7V, the output impedance at 1.0 GHz varies from 318 Ohms to 108 Ohms. Such a dynamic output impedance change may cause instability of the active circulator during the Vgs transition from the off-state, which is a Vgs less than −3.0V, to the bias point of approximately −2.7V, unless a complex stabilization circuit is added.

What is needed is an improved active circulator, with higher bandwidth and improved power handling capability, and which is stable, while operating in an energy efficient manner. The embodiments of the present disclosure answer these and other needs.

SUMMARY

In a first embodiment disclosed herein, a multi-port active circulator comprises a plurality of cascode circuits coupled to one another in a ring, wherein each respective cascode circuit of the plurality of cascode circuits is coupled to a respective port of a plurality of ports, wherein each respective cascode circuit comprises a common source transistor, a common gate transistor coupled to the common source transistor, and a feedback circuit coupled from the common gate transistor to the common source transistor, and wherein the common source transistor of each respective cascode circuit is coupled to a common junction point.

In another embodiment disclosed herein, a multi-port active circulator comprises a plurality of cascode circuits, wherein each respective cascode circuit of the plurality of cascode circuits is coupled to a respective RF port of a plurality of RF ports, wherein each respective cascode circuit comprises a first transistor having a first gate, a first source, and a first drain, a second transistor having a second gate coupled to a gate bias voltage, a second source coupled to the first drain, and a second drain, a feedback resistor coupled to the second drain, and a feedback capacitor coupled to the feedback resistor and to the first gate, and wherein each first source is coupled to a common junction point.

In yet another embodiment disclosed herein, a method of forming a multi-port active circulator comprises forming a plurality of cascode circuits coupled to one another in a ring, coupling each respective cascode circuit of the plurality of cascode circuits to a respective port of a plurality of ports, and coupling each respective common source transistor of each respective cascode circuit to a common junction point, wherein each respective cascode circuit comprises a common source transistor, a common gate transistor coupled to the common source transistor, and a feedback circuit from the common gate transistor to the common source transistor.

These and other features and advantages will become further apparent from the detailed description and accompanying figures that follow. In the figures and description, numerals indicate the various features, like numerals referring to like features throughout both the drawings and the description.

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

FIG. 1 depicts a schematic diagram of the prior art active circulator 100 described in U.S. patent application Ser. No. 14/554,995, filed Nov. 26, 2014. The active circulator consists of three or more transistors (FET1, FET2 and FET3) arranged in a ring, with RC feedback and common ground resistors. The gate bias Vgs of the each of the three transistors FET1, FET2 and FET3 is provided through one of three choke inductors $11_1$ inside each of three RF chokes 11, while the drain bias Vds of the each of the three transistors FET1, FET2 and FET3 is provided through one of three choke inductors $10_1$ inside each of three RF chokes 10. The three transistors FET1, FET2 and FET3 may be field effect transistors (FETs), high electron mobility transistors (HEMTs), CMOS FETs, or other types of transistors including bipolar junction transistors and laterally diffused metal oxide semiconductor transistors, to name a few. Therefore the use of nomenclature "FET" with respect to transistors FET1, FET2 and FET3 does not exclude the use of other types of transistors as FET1, FET2 and FET3. However, if a FET-type transistor (HEMT, LDMOS, CMOS, etc.) is utilized for transistors FET1, FET2 and FET3, then the three choke inductors $11_1$ inside each of three RF chokes 11 may be replaced with high resistance resistors, since FET type devices do not draw a bias current at their gates. Also the three resistors $11_1$ are easier to implement than a conventional inductor if the active circulator 100 is implemented as a monolithic microwave integrated circuit (MMIC). If bipolar transistors are used instead of FETs for FET1, FET2 and FET3, then replacing the three choke inductors $11_1$ with high resistance resistors may lead to some DC power loss.

Each of the three RF signals for the circulator 100 are applied at the three ports (RF Port1, RF Port2, RF Port3) and are each introduced through a bypass capacitor $11_c$ in each of the RF chokes 11. For a monolithic microwave integrated circuit (MMIC) embodiment, each choke inductor $11_1$ to Vgs can be replaced with a high resistance resistor, as discussed above, particularly if FET-type transistors are used as transistors FET1, FET2 and FET3) and each bypass capacitor $11_c$ can be a high capacitance preferably sufficiently large to pass the signal with as little loss as reasonable given the fact that impedance of inductor/resistor should be much greater than the impedance of the capacitor at the frequency of the RF signal at RF Port1, RF Port2 or RF Port3. Alternatively, choke inductors $11_1$ may be replaced with a shorted λ/4 (quarter wave length) transmission line stub or with an active load. Similarly, choke inductors $10_1$ may be replaced with a shorted λ/4 (quarter wave length) transmission line stub or with an impedance convertor.

The RF chokes 10, 11 are each depicted in FIG. 1 as a simple LC choke. More complex choke designs, and even simpler choke designs, may be substituted therefor so long as (i) in the case of RF chokes 11, the bias voltage Vgs has a direct current (DC) path to the gate of the particular transistor (FET1, FET2 or FET3) to which it applies a bias voltage or (ii) in the case of RF chokes 10, the bias voltage Vds has a DC path to the drain of the particular transistor (FET1, FET2 or FET3) to which it applies a bias voltage. Only one of the three RF chokes 11 has its internal capacitor $11_c$ and inductor (or resistor) $11_1$ labeled as such for ease of illustration, it being understood that the other two chokes 11 should be considered as having their internal capacitor and inductor labeled in the same way and that the internal inductor may be implemented as a resistor, stub or impedance convertor as mentioned above. Similarly, only one of the three RF chokes 10 has its internal capacitor $10_c$ and inductor $10_1$ labeled as such for ease of illustration, it being understood that the other two chokes 10 should be considered as having their internal capacitor and inductor labeled in the same way and that the internal inductor may be implemented as a stub or impedance convertor.

When an RF signal is applied at an RF Port and to the control electrode of the transistor coupled to the output of the RF choke 11 at the same RF port, the RF signal is sent to the next RF Port and output there is as usually done in the circulator art. The control electrode is a gate for a field effect transistor, or is a base for a bipolar junction transistor. Also, if bipolar transistors are used for FET1, FET2 and FET3, then a person skilled in the art would understand that in the description of a gate is changed to a base, a drain is changed to an emitter, and a source is changed to a collector.

In FIG. 1 an RF signal applied for example at RF Port1 will emerge at RF Port2 but be isolated from RF Port3. The direction of rotation is counterclockwise in FIG. 1. The RF signal path from RF Port1 to RF Port2 is denoted by arrow $A_{12}$. Similarly, the RF signal path from RF Port2 to RF Port3 is denoted by arrow $A_{23}$ and the RF signal path from RF Port3 and RF Port1 is denoted by arrow $A_{31}$.

The RF signal paths are shown with elements 12 in those paths. Elements 12 merely denote that those paths are preferably either entirely or partially formed as a microstrip, so the depicted conductors in the RF signal path A12 connecting the output of RF choke 11, which is also connected to the gate of FET1 to the drain of FET2 are preferably implemented as microstrips, particularly if the disclosed active circulator is embodied as a MMIC where those conductors are preferably spaced from an underlying ground plate (not shown) by a dielectric layer (also not shown) formed as a part of the MMIC.

The sources of the transistors FET1, FET2 and FET3 are each connected by conductor to a central junction point 20, each such conductor being preferably implemented as a microstrip 13 as discussed above with reference to microstrips 12. The central junction point 20 is coupled to DC ground preferably via a parallel arrangement of a resistor Rcm 21 and an inductor Lcm 22.

At each RF Port, a resistor Rfb 18 and a capacitor Cfb 16 provide a feedback path from the drain to the gate of, for example, FET1 and for normal values thereof they do not produce any DC loss or significant RF loss. The resistor 18 and capacitor 16 may be arranged in a parallel arrangement as opposed to the series arrangement shown in FIG. 1. Nevertheless, the depicted series arrangement is believed to be superior in order to separate the drain bias voltage Vds from the gate bias voltage Vgs.

The drain current is provided from Vds through the choke inductor $10_1$ of RF choke 10, and grounded through the common ground choke inductor Lcm 22 and the common ground resistor Rcm 21 at central junction point 20. For the single transistor configuration of FIG. 1 the drain current at each port passes through a single transistor, such as FET1. The choke inductors in RF chokes 10 and 11 completely choke the RF signal at both the drain and source, effectively delivering DC current without DC loss.

As described above, the prior art configuration shown in FIG. 1 may easily have an unwanted oscillation, because a dynamic output impedance change may cause instability of the active circulator, unless a complex stabilization circuit is added.

Figure 3:
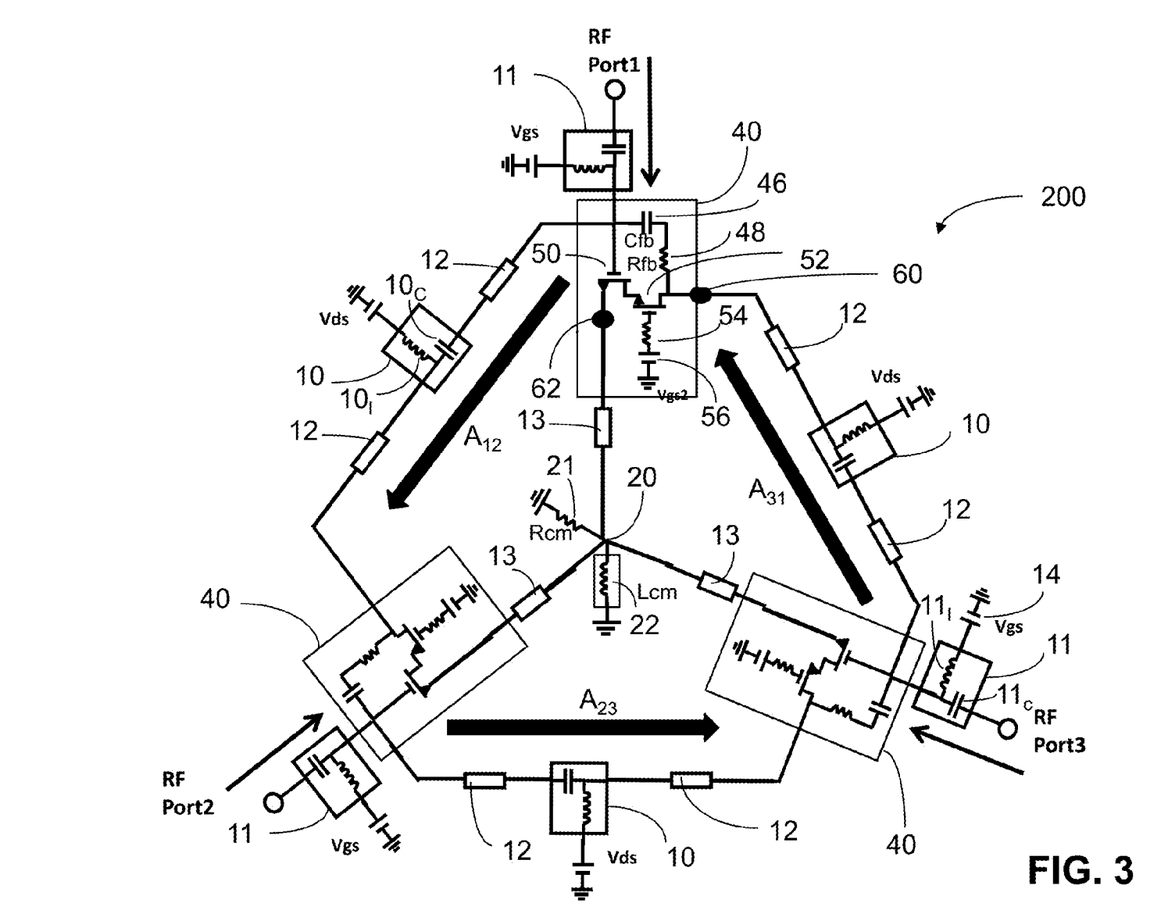
FIG. 3 shows an active circulator in accordance with the present disclosure.

In the present disclosure, an active circulator 200 is described that has a cascode configuration, as shown in FIG. 3, which provides improved stability, higher output impedance, and better isolation. For example, the active circulator 200 has improved stability, higher output impedance, and better isolation between node 60 and node 62 in FIG. 3.

As discussed above, in the active circulator of FIG. 1, a single transistor, such as FET1 has a gate connected to the RF port 1 by way of the RF choke 11, with the source of FET 1 coupled to the central junction point 20, and the drain of FET 1 coupled to the preceding port, which is RF port 3 in FIG. 1.

In the active circulator with cascode transistors 200 shown in FIG. 3 in accordance with the present disclosure, the FET1, resistor 18 and capacitor 16 at each RF Port in FIG. 1, is replaced with a cascode circuit 40 at each RF port that has two transistors, transistor 50 and transistor 52. For example, RF Port 1 is coupled by way of RF choke 11 to cascode circuit 40.

The cascode circuits 40 are arranged and coupled to one another in a ring as shown in FIG. 3, and each cascode circuit 40 is coupled to one of the ports. FIG. 3 shows three RF ports, however the number of ports and therefore cascode circuits 40 may be as few as two and greater than three.

Transistor 50, which is the common source transistor of the cascode circuit 40, has a gate connected to the RF choke 11, a source coupled to the central junction point 20 by way of element 13, which may be a microstrip, and a drain coupled to the source of transistor 52, which is the common gate transistor of the cascode circuit 40. The gate of transistor 52 is coupled to a common gate bias voltage Vgc 56 through element 54, which may be an inductor or a resistor. The drain of transistor 52 is coupled to the preceding port by elements 12, which as described above may be microstrips, and RF choke 10.

Resistor Rfb 48 and capacitor Cfb 46, which are in series, provide a feedback path between the common gate transistor 50 and the common source transistor 52, and are connected between the gate of the common source transistor 50 and the drain of the common gate transistor 52.

The drain current of transistor 52 is provided from Vds through the choke inductor $10_1$ of RF choke 10, as shown in FIG. 3. After proceeding from the source of transistor 52 to the drain of transistor 50, the current is grounded through the common ground choke inductor Lcm 22 and the common ground resistor Rcm 21 at the central junction point 20, which are connected via element 13 to the source of transistor 50. Therefore, for the active circulator cascode configuration 200 of FIG. 3 the drain current from Vds at each port passes through two transistors, transistor 50 and transistor 52.

The cascode circuit 40 is repeated at each port. Transistors 50 and 52 may be FETs, high electron mobility transistors (HEMTs), CMOS FETs, or other types of transistors including bipolar junction transistors and laterally diffused metal oxide semiconductor transistors. If bipolar transistors are used then a person skilled in the art would understand that in the above description a gate is changed to a base, a drain is changed to an emitter, and a source is changed to a collector.

The gate bias Vgs 14 to the gate of transistor 50 for each cascode circuit 40 is provided through one of three choke inductors $11_1$ inside each of three RF chokes 11. The drain bias Vds to the drain of transistor 52 for each cascode circuit 40 is provided through one of three choke inductors $10_1$ inside each of three RF chokes 10.

In FIG. 3 an RF signal applied for example at RF Port 1 will emerge at RF Port 2 but be isolated from RF Port 3. The direction of rotation is counterclockwise in FIG. 3. The RF signal path from RF port 1 to RF port 2 is denoted by arrow $A_{12}$. Similarly, the RF signal path from RF port 2 to RF port 3 is denoted by arrow $A_{23}$ and the RF signal path from RF port 3 to RF port 1 is denoted by arrow $A_{31}$.

A low frequency cascode transistor analysis has been performed and shows that the active circulator 200 with a cascode circuit 40 has an output impedance of $r01+r02+gm2 \cdot r01 \cdot r02$, where r01 is the output impedance of transistor 50, which is the common source transistor in the cascode circuit 40, and r02 and gm2 are the output impedance and transconductance of the transistor 52, which is the common gate transistor in the cascode circuit 40. The result is higher output impedance for the cascode circuit 40 of FIG. 3 than the output impedance of the single transistor configuration, shown in FIG. 1. The higher output impedance improves the active circulator stability during a bias voltage transition without disturbing the operating condition. Reverse isolation for the cascode configuration is also better, since the common gate transistor 52 acts as an impedance transformer. The improved isolation also reduces unwanted signal feedback at a relatively higher frequency and helps the stability and broadband matching. The cascode circuit configuration also reduces input Miller capacitance. Thus, broadband input matching is improved, which improves the bandwidth of the active circulator with a cascode configuration.

The active circulator with a cascode configuration also improves the maximum RF voltage swing over the single transistor configuration, because the drain voltage Vds is split between the two transistors 50 and 52. Therefore, the cascode configuration of FIG. 3 is able to handle double the Vds compared to the single transistor configuration of FIG. 1. The RF output voltage swing at an RF port may also be twice the voltage swing for the cascode active circulator configuration of FIG. 3 compared to the single transistor active circulator of FIG. 1. The doubling of the RF output voltage swing at an RF port results in an approximately 3 dB higher power handling capability for the active circulator with a cascode configuration, shown in FIG. 3, compared to the single transistor active circulator of FIG. 1.

To verify the operation of the cascode configuration active circulator of the present disclosure, simulations were performed and compared with simulations of the single transistor active circulator of FIG. 1. The simulations used the same or similar parameter assumptions for the transistors, assembly and housing. The simulations used GaN high electron mobility transistors (HEMTs) for the transistors.

Table 1 below shows the design parameters for each simulation.

TABLE 1

DESIGN PARAMETER COMPARISON

|  | Single Transistor Active Circulator (FIG. 1) | Cascade Transistor Active Circulator (FIG. 3) |
|---|---|---|
| Transistor | GaN HEMT | GaN HEMT |
| Transistor size | 450 um | 600 um (Common Source Transistor 50) 330 um (Common Gate Transistor 52) |
| Vds | 10 V | 20 V |
| Ids | ~12 mA | ~12 mA |
| Rfb 18/48 | 90 Ohm | 100 Ohm |
| Rcm 21 | 250 Ohm | 120 Ohm |

As shown in TABLE 1 the size of the common source transistor 50 used in the simulations is 600 um, and the size of the common gate transistor 52 used in the simulations is 330 um. The sizes of the common source transistor 50 and the common gate transistor 52 may be the same or be different. Preferably, the size of the common source transistor 50 divided by the size of the common gate transistor 52 has a quotient that ranges from 0.5 to 2.0.

Figure 4:
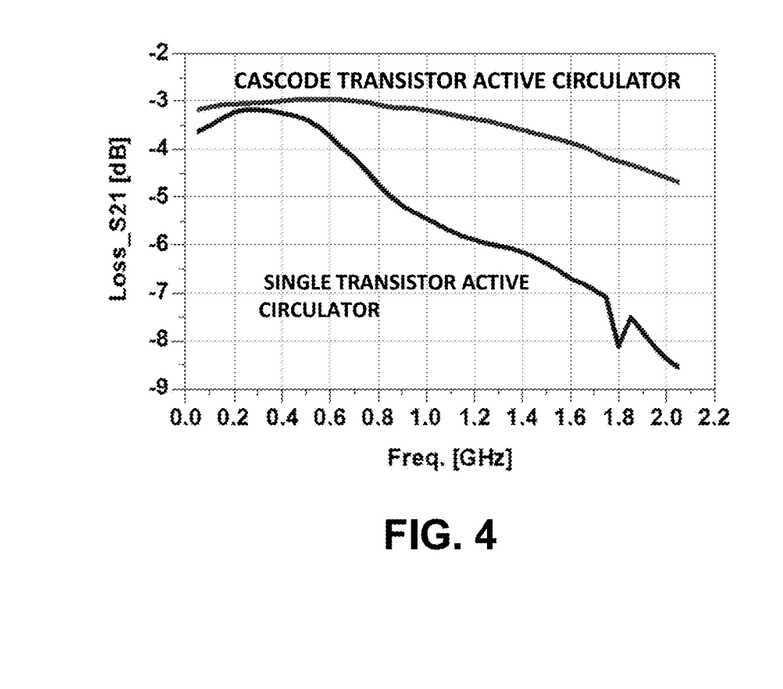
FIG. 4 shows a loss comparison at 30 dBm input power.

FIG. 4 shows a graph comparing the RF loss for the configurations of FIG. 1 and FIG. 3 over a frequency sweep. The comparison was performed with a 30 dBm input driving power and frequency was swept from 0.1 GHz to 2.0 GHz. The RF loss S21 of the single transistor active circulator of FIG. 1 greatly increases after ~0.5 GHz, while the cascode transistor active circulator of FIG. 3 has an RF loss S21 that only slightly increases over the frequency sweep. At 2 GHz, FIG. 4 shows that the single transistor active circulator has an approximately 4 dB greater loss than the cascode transistor active circulator.

Figure 5:
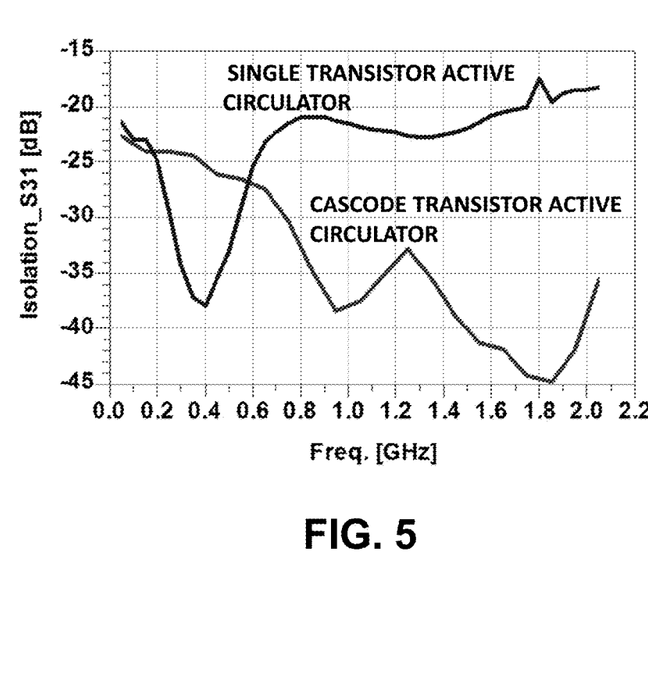
FIG. 5 shows an isolation comparison at 30 dBm input power.

FIG. 5 shows a graph comparing the isolation S31 for the configurations of FIG. 1 and FIG. 3 over the frequency sweep from 0.1 GHz to 2.0 GHz for the 30 dBm input driving power. The graph of FIG. 5 shows that the cascode transistor active circulator has improved isolation S31 in the frequency range of about 0.5 GHz to 2.0 GHz, and at about 1.8 GHz has a 25 dB better isolation S31 in comparison to the single transistor active circulator.

Figure 6:
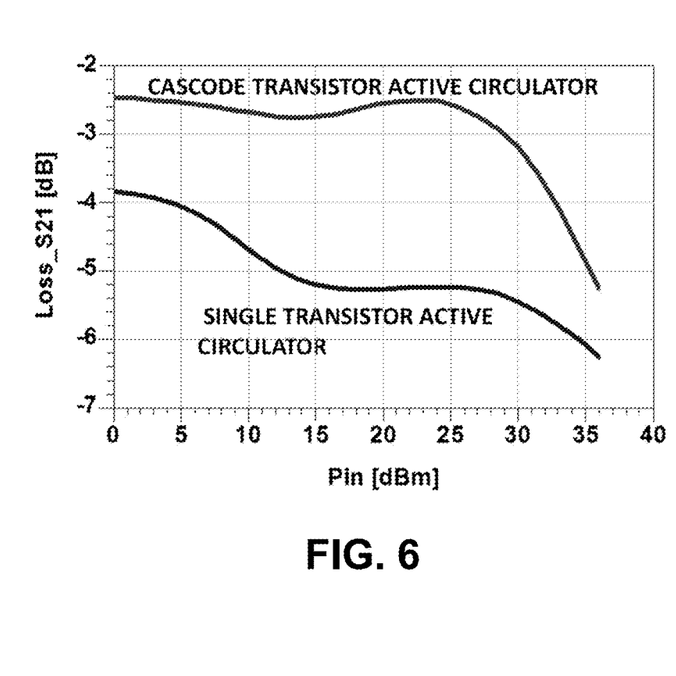
FIG. 6 shows a simulation loss comparison at 1 GHz.
Figure 7:
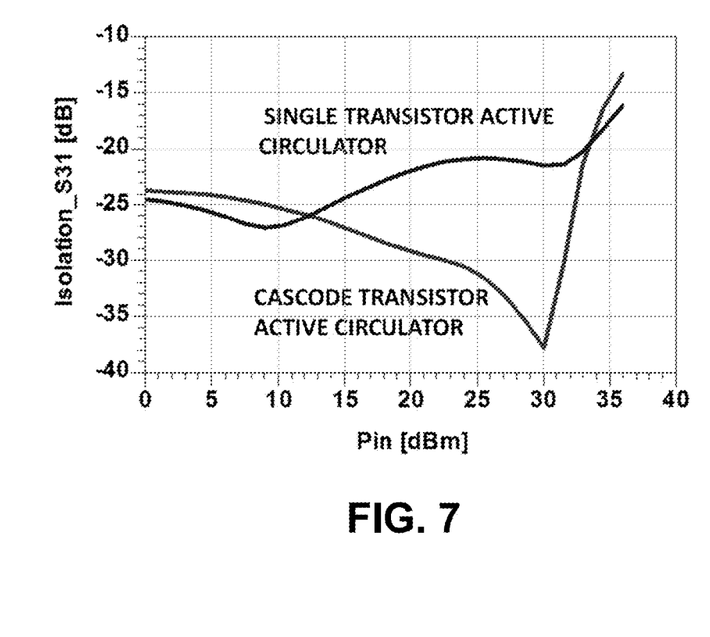
FIG. 7 shows a simulated isolation comparison at 1 GHz.

To compare the power handling capability, each circulator input power $P_{in}$ was driven from 0 dBm to 36 dBm at 1.0 GHz. FIG. 6 shows that the loss S21 for the cascode transistor active circulator of FIG. 3 is less than the single transistor active circulator of FIG. 1, and is maximally 2.5 dB less loss when the input power $P_{in}$ is driven from 0 dBm to 36 dBm at 1.0 GHz. FIG. 7 shows that the cascode transistor active circulator of FIG. 3 has up to about 30 dB better isolation than the single transistor active circulator of FIG. 1.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:

1. A multi-port active circulator comprising:
   a plurality of cascode circuits coupled to one another in a ring;
   a central junction point;
   wherein each respective cascode circuit of the plurality of cascode circuits is coupled to a respective port of a plurality of ports;
   wherein each respective cascode circuit is coupled to the central junction point;
   wherein each respective cascode circuit comprises:
      a first transistor;
      a second transistor coupled to the first transistor; and
      a feedback circuit coupled from the second transistor to the first transistor; and
   wherein the first transistor of each respective cascode circuit is coupled to the central junction point.

2. The multi-port active circulator of claim 1 wherein:
   each first transistor has a first gate, a first source, and a first drain;
   each second transistor has a second gate coupled to a gate bias voltage, a second source coupled to the first drain, and a second drain; and
   each feedback circuit comprises a feedback resistor coupled to the second drain and a feedback capacitor coupled to the feedback resistor and the first gate.

3. The multi-port active circulator of claim 2 wherein:
   the first gate of a first respective cascode circuit is coupled to a second drain of another respective cascode circuit;
   the second drain of the first respective cascode circuit is coupled to a first gate of another respective cascode circuit; and
   the second gate is coupled to a respective choke resistor or a respective choke inductor connected to the gate bias voltage.

4. The multi-port active circulator of claim 1 further comprising:
   a plurality of first RF chokes between each respective port and each respective cascode circuit.

5. The multi-port active circulator of claim 1 further comprising:
a plurality of second RF chokes;
wherein a respective one of the plurality of second RF chokes is between one respective cascode circuit and another respective cascode circuit.

6. The multi-port active circulator of claim 1 further comprising:
a resistor coupled between the central junction point and a ground; and
an inductor coupled between the central junction point and the ground.

7. The multi-port active circulator of claim 1 wherein:
a first size of the first transistor is the same as a second size of the second common gate transistor; or
a first size of the first transistor divided by a second size of the second transistor has a quotient that ranges from 0.5 to 2.0.

8. The multi-port active circulator of claim 1 wherein:
each cascode circuit has an output impedance that is the sum of r01, r02 and the product of gm2 multiplied by r01 and multiplied by r02;
wherein r01 is an output impedance of the first transistor;
wherein r02 is an output impedance of the second transistor; and
wherein gm2 is a transconductance of the second transistor.

9. A multi-port active circulator comprising:
a plurality of cascode circuits, wherein each respective cascode circuit of the plurality of cascode circuits is coupled to a respective RF port of a plurality of RF ports;
wherein each respective cascode circuit comprises:
    a first transistor having a first gate, a first source, and a first drain;
    a second transistor having a second gate coupled to a gate bias voltage, a second source coupled to the first drain, and a second drain;
    a feedback resistor coupled to the second drain; and
    a feedback capacitor coupled to the feedback resistor and to the first gate; and
wherein each first source is coupled to a central junction point.

10. The multi-port active circulator of claim 9 wherein:
the first gate of a first respective cascode circuit is coupled to a second drain of another respective cascode circuit; and
the second drain of the first respective cascode circuit is coupled to a first gate of another respective cascode circuit.

11. The multi-port active circulator of claim 9 wherein the second gate is coupled to a respective choke resistor or a respective choke inductor connected to the gate bias voltage.

12. The multi-port active circulator of claim 9 further comprising:
a plurality of first RF chokes;
wherein each respective first RF choke is coupled to a respective RF port and to a respective first gate and is between the respective RF port and to the respective first gate; and
wherein each respective first RF choke comprises:
    a capacitor coupled to the respective RF port and the respective first gate; and
    an inductor coupled to the respective first gate and to a bias voltage for the first gate.

13. The multi-port active circulator of claim 9 further comprising:
a plurality of second RF chokes;
wherein each respective second RF choke is coupled to a respective second drain of one of the plurality of cascode circuits and coupled to a respective first gate of another one of the plurality of cascode circuits; and
wherein each second RF choke comprises:
    a capacitor coupled to the respective second drain of the one of the plurality of cascode circuits and coupled to the respective first gate of the another one of the plurality of cascode circuits; and
    an inductor coupled to the respective second drain of the one of the plurality of cascode circuits and to a drain bias voltage.

14. The multi-port active circulator of claim 13 wherein each second RF choke further comprises:
a first microstrip coupled between the capacitor and the respective second drain of the one of the plurality of cascode circuits; and
a second microstrip coupled between the capacitor and the respective first gate of the another one of the plurality of cascode circuits.

15. The multi-port active circulator of claim 9 wherein:
the first transistor is a field effect transistor; and
the second transistor is a field effect transistor.

16. The multi-port active circulator of claim 9 wherein:
the first transistor is a bipolar junction transistor and the first gate is a first base, the first source is a first collector, and the first drain is a first emitter; and
the second transistor is a bipolar junction transistor and the second gate is a second base, the second source is a second collector, and the second drain is a second emitter.

17. The multi-port active circulator of claim 9 further comprising:
a resistor coupled between the central junction point and a ground; and
an inductor coupled between the central junction point and the ground.

18. The multi-port active circulator of claim 9 wherein:
a first size of the first transistor is the same as a second size of the second transistor; or
a first size of the first transistor divided by a second size of the second transistor has a quotient that ranges from 0.5 to 2.0.

19. The multi-port active circulator of claim 9 wherein:
each cascode circuit has an output impedance that is the sum of r01, r02 and the product of gm2 multiplied by r01 and multiplied by r02;
wherein r01 is an output impedance of the first transistor;
wherein r02 is an output impedance of the second transistor; and
wherein gm2 is a transconductance of the second transistor.

20. A method of forming a multi-port active circulator comprising:
forming a plurality of cascode circuits coupled to one another in a ring, wherein each cascode circuit comprises a first and a second transistor;
coupling each respective cascode circuit of the plurality of cascode circuits to a respective port of a plurality of ports; and
coupling each respective first transistor of each respective cascode circuit to a central junction point;

wherein each respective cascode circuit comprises:
   the first transistor;
   the second transistor coupled to the first transistor; and
   a feedback circuit coupled from the second transistor to the first transistor.

21. The method of claim 20 wherein:
a first size of the first transistor is the same as a second size of the second transistor; or
a first size of the first transistor divided by a second size of the second transistor has a quotient that ranges from 0.5 to 2.0.

22. The method of claim 20 wherein:
each cascode circuit has an output impedance that is the sum of r01, r02 and the product of gm2 multiplied by r01 and multiplied by r02;
wherein r01 is an output impedance of the first transistor;
wherein r02 is an output impedance of the second transistor; and
wherein gm2 is a transconductance of the second transistor.

* * * * *